US005602366A

United States Patent [19]

Whelan et al.

[11] Patent Number: 5,602,366

[45] Date of Patent: Feb. 11, 1997

[54] SPACEFRAME WITH ARRAY ELEMENT POSITIONING

[75] Inventors: Michael J. Whelan, Simi Valley; William J. Gelow, Thousand Oaks, both of Calif.

[73] Assignee: Harman International Industries Incorporated, Northridge, Calif.

[21] Appl. No.: 542,364

[22] Filed: Oct. 12, 1995

[51] Int. Cl.[6] ........ H05K 5/00

[52] U.S. Cl. ........ 181/144; 181/148; 181/499

[58] Field of Search ........ 181/144, 145, 181/148, 154, 199; 381/90, 205

[56] References Cited

U.S. PATENT DOCUMENTS

| | | | |
|---|---|---|---|
| 1,866,831 | 7/1932 | Wolff et al. | 181/199 |
| 4,014,597 | 3/1977 | Griffin, Jr. | 181/199 |
| 4,054,750 | 10/1977 | Montgomery et al. . | |
| 4,107,461 | 8/1978 | Bose . | |
| 4,179,585 | 12/1979 | Herrenschmidt . | |
| 4,227,047 | 10/1980 | Horne . | |
| 4,270,023 | 5/1981 | Beveridge . | |
| 4,701,951 | 10/1987 | Kash . | |
| 4,730,693 | 3/1988 | Kobus | 181/199 X |
| 4,882,760 | 11/1989 | Yee . | |
| 4,884,655 | 12/1989 | Freadman et al. | 181/145 |
| 5,000,286 | 3/1991 | Crawford et al. | 181/145 |
| 5,258,584 | 11/1993 | Hubbard . | |
| 5,266,751 | 11/1993 | Taguchi | 181/144 |
| 5,309,518 | 5/1994 | Ickler et al. . | |
| 5,402,502 | 3/1995 | Boothroyd et al. . | |

*Primary Examiner*—Khanh Dang
*Attorney, Agent, or Firm*—Jones, Day, Reavis & Pogue

[57] ABSTRACT

Method and apparatus for obtaining curved array performance from an array of loudspeakers suspended within a simple vertical framework in which each loudspeaker system is suspended within a separate frame structure with a tilting mechanism that allows the loudspeaker sound-emitting access to be changed in a vertical plane to a desired position.

12 Claims, 2 Drawing Sheets

SPACEFRAME WITH ARRAY ELEMENT POSITIONING

BACKGROUND OF THE INVENTION

1. Field of the Invention

The present invention relates in general to loudspeaker array systems and in particular to a loudspeaker array system in which the individual loudspeakers may be quickly assembled and disassembled to provide a predetermined sound pattern by selective positioning of the loudspeaker array elements.

2. Description of Related Art

Users of portable, large sound systems for commercial applications such as rock concerts must quickly assemble and suspend an array of loudspeaker systems. After the performance, the array of loudspeakers must be quickly disassembled. This array must completely cover the audience and be configured to do so in many different size and shape venues. The ability to always connect the loudspeaker system together accurately and with simplicity into the desired physical array greatly speeds setup time while reducing the opportunity for poor coverage and unsafe assembly. Provision to "aim" each loudspeaker sound axis in the vertical plane is required for good coverage.

A prior art system is illustrated in FIG. 1 herein, in which the system 10 includes horizontal bars 12 suspended in the air in any well-known manner as from a staging frame or as a part of a staging frame (not shown). Suspended from the bars 12 is a plurality of loudspeaker arrays 14, 16, 18, and 20. Each of the loudspeaker arrays 14–20 has some means, such as an eye at the top and 24 at the bottom, for connecting each loudspeaker array to the adjacent array and to the support bar 12 by any well-known means such as by cables 26. This allows a flexible connection between each of the adjacent loudspeaker arrays 14, 16, 18, and 20. In order to provide a curved array, cables 28 are connected between the bottom of the lowermost speaker array 20 and the upper suspension bars 12. By using a racheting device 30, the cables 28 may be shortened to pull the bottom speaker array 20 inwardly thus forming a generally curved speaker array as illustrated in FIG. 1.

To provide such curved array is time consuming, difficult and potentially hazardous. First, the uppermost array 14 must be attached by the cables 26 to the support beam 12. Then each of the speaker arrays 16, 18, and 20 must in turn be held in the proper position while the cables 26 are connected between it and the next adjacent array above it. Finally, the adjusting cable 28 must be connected between the lowest array 20 and the support bars 12 and the racheting mechanisms 30 adjusted until the desired sound pattern is achieved. In FIG. 1, the direction of sound for each of the loudspeaker systems 14, 16, 18, and 20 to form a curved sound pattern is illustrated by the phantom lines 32, 34, 36, and 38, respectively.

It would be advantageous to have a sound system array that could be provided with loudspeakers suspended within a simple vertical framework and wherein each of the loudspeakers could be quickly and easily adjusted with a vertical tilting mechanism to obtain curved array performance safely and easily.

SUMMARY OF THE INVENTION

The present invention provides the ability to obtain curved array performance from an array of loudspeakers suspended within a simple vertical framework. This is achieved by mounting each individual loudspeaker system with a tilting mechanism in a spaceframe. The spaceframe is used to suspend and attach multiple loudspeaker systems together with each of the loudspeakers being pivotable in a vertical plane with respect to its frame such that its sound-emitting axis may be directed at a particular angle with respect to the horizon.

Each of the frame structures having a loudspeaker array therein has a top and a bottom and a front and a back. A loudspeaker array having a sound-emitting axis is pivotally mounted inside each frame structure for pivotal movement between the front and back of the frame structure. An adjustable length connector is extendably attached between the frame structure and the loudspeaker array for positioning the loudspeaker array in an arcuate position about said pivotal mount between the front and back so as to aim the loudspeaker sound-emitting axis in a given direction in the vertical plane with respect to the frame structure and the horizontal.

The adjustable length connector may be of any type but in the preferred embodiment includes at least a first rod slidably inserted within a second rod. One end of the telescoping rod is pivotally attached to the frame structure and the other end is pivotally attached to the loudspeaker such that by changing the length of the telescoping rod the sound-emitting axis of the loudspeaker is changed in the vertical plane. A quick disconnect latching mechanism is attached to the telescoping rod to lock the telescoping rod in the desired fixed length. The quick disconnect mechanism includes a plurality of spaced mating openings in the telescoping rod and with a spring-loaded pin attached to the outer telescoping rod to removably engage the mating orifices and lock the telescoping rods at a desired fixed length.

The stacked frame structures are rigidly attached to each other. At least one horizontal leg is formed on each of the stacked frame structures in mating stacked relationship with a corresponding horizontal leg on the adjacent stacked frame structure. The mating horizontal legs have slots therein forming an "I" shape when the legs are in abutting relationship. An I-shaped beam is removably inserted in the I-shaped slot to form a quick disconnect for easy assembly and disassembly of the stacked adjacent frame structures.

Thus it is an object of the present invention to obtain curved array performance from an array of loudspeakers suspended within a simple rigid vertical framework.

It is a further object of the present invention to mount a loudspeaker system with a tilting mechanism in a spaceframe.

It is still another object of the present invention to rigidly stack a plurality of spaceframe structures each of which has a loudspeaker array pivotally mounted therein such that each of the loudspeaker arrays can be pivoted to a desired position to aim the sound-emitting axis of the loudspeaker in a desired direction to provide curved array performance.

Thus, the present invention relates to apparatus for providing a predetermined loudspeaker sound pattern including a plurality of stacked frame structures rigidly attached to each other, a loudspeaker array pivotally mounted in each frame structure and having a sound-emitting axis, and an adjustable length connector pivotally connected between each frame structure and each corresponding loudspeaker array for pivotally moving the loudspeaker array to aim the sound-emitting axis of each loudspeaker array in a vertical plane with respect to the stacked frame structure and to the horizontal for creating a predetermined sound pattern.

The invention also relates to a method of providing curved performance of a loudspeaker array comprising the steps of arranging a plurality of loudspeakers in a vertical frame, pivotally attaching each of the loudspeakers to the vertical frame for pivotal movement in the vertical plane, and adjusting each loudspeaker in the frame at a predetermined angle with respect to the horizontal to provide the curved performance.

BRIEF DESCRIPTION OF THE DRAWINGS

These and other objects of the present invention will be more fully disclosed when taken in conjunction with the following DETAILED DESCRIPTION OF THE PRESENT INVENTION as shown in the drawings wherein like numerals represent like elements and wherein.

DETAILED DESCRIPTION OF THE PRESENT INVENTION

Figure 2:
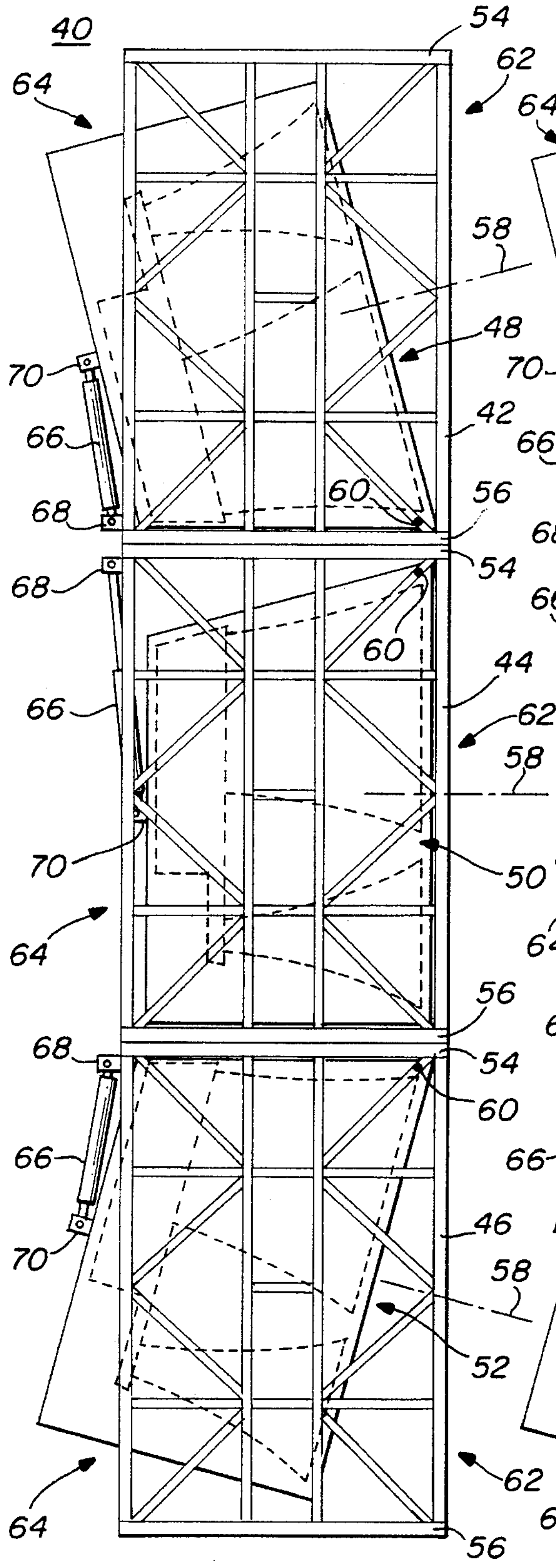
FIG. 2 illustrates the present invention in which high frequency speakers and mid-range frequency speakers are adjusted.

FIG. 2 illustrates a spaceframe with loudspeaker array positioning including a plurality of frame structures 42, 44, and 46 each having a top 54 and a bottom 56. Each of the frame structures 42, 44, and 46 has a corresponding loudspeaker array 48, 50, and 52. Each of the loudspeaker arrays 48, 50, and 52 has a sound-emitting axis 58 and is pivotally attached inside said frame structure at a point 60 for pivotal movement between the front 62 and the back 64 of each array. An adjustable length connector 66 is extendably attached between each frame structure and its corresponding loudspeaker array for positioning the loudspeaker array in an arcuate position about the pivotal mount 60 between the front 62 and the back 64 so as to position the loudspeaker sound-emitting axis 58 in a given direction in a vertical plane with respect to the frame structure. Thus, in FIG. 2, in frame structure 42, the loudspeaker array 48 is pivotally connected at 60 to the frame structure 42. The adjustable length connector or arm 66 is pivotally connected at 68 to the frame structure 42 and to the loudspeaker array 48 at pivot point 70. As shown hereafter in relation to FIG. 5, the adjustable arm 66 may be extended from the position shown in frame 42 to that shown in frame 44 to cause the speaker array 58 to aim its sound-emitting axis 58 in a horizontal plane.

By turning the frame structure 42 at the top upside down and placing it on the bottom as frame structure 46, its sound-emitting axis 58 will be pointed downwardly below the horizon as shown. Thus, as illustrated in FIG. 2, the three frame structures 42, 44, and 46 have the loudspeaker systems 48, 50 and 52 respectively adjusted such that each of their sound-emitting axes are aimed in a different direction to form a curved array sound pattern.

Figure 3:
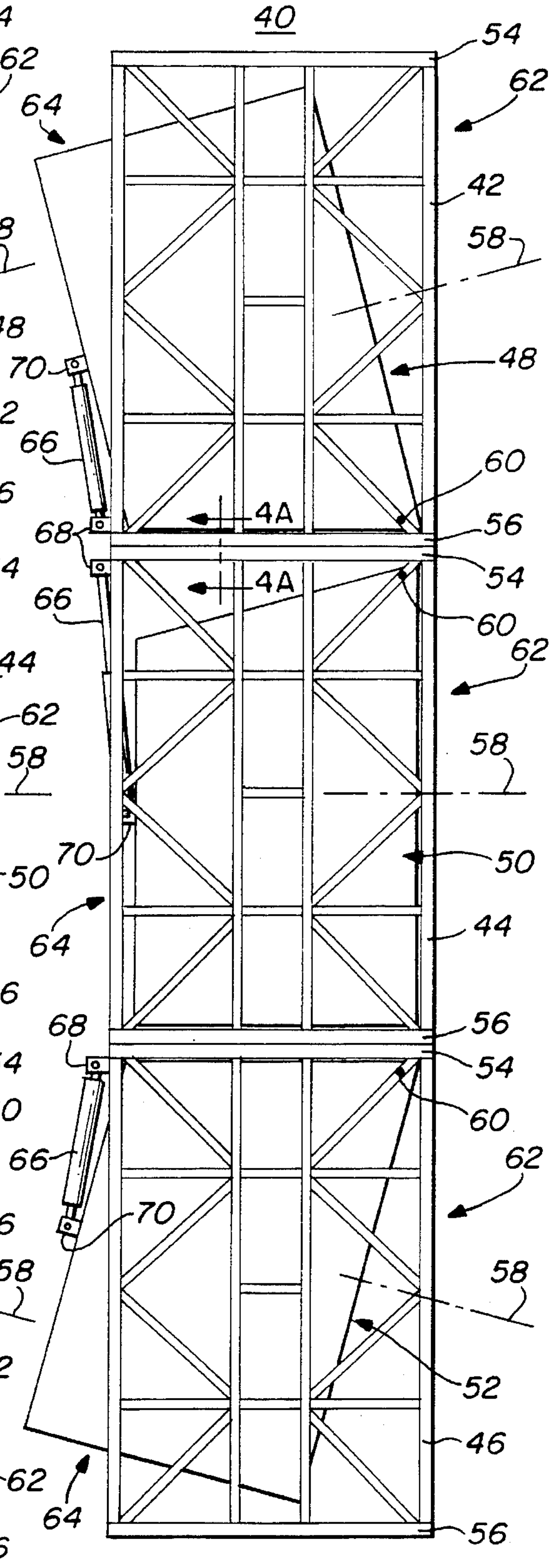
FIG. 3 illustrates the present invention in which low frequency loudspeakers are adjusted.

FIG. 3 illustrates the same type of arrangements as in FIG. 2 except that each of the loudspeakers is a low frequency loudspeaker. Clearly, the frame structures could be arranged in any desired manner with any particular combination of high and mid-range frequency speakers and low frequency speakers.

Figure 4A:
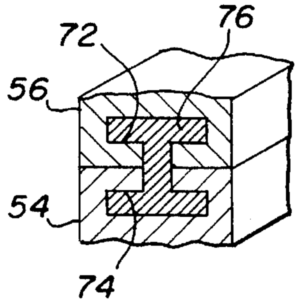
FIGS. 4A and 4B are partial views of the stacked frames rigidly connected to each other arid the quick-disconnect device for attaching adjacent frames.
Figure 4B:
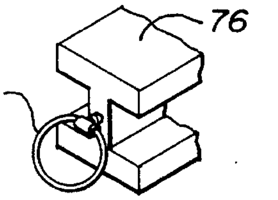

It is extremely important that these frame structures 42, 44, and 46 be capable of being joined to each other in a rigid manner quickly and efficiently to form a safe structure. Such a means is shown in FIG. 4A and 4B. In FIG. 4A, a T-shaped channel 72 extends at least partially through the horizontally leg portion 56 on the bottom of each frame structure.

An inverted T-shaped channel 74 extends at least partially through the horizontal leg portion 54 ion the top of each frame structure such that when one frame structure sits on top of the other an I-shaped channel is formed as shown. As partially illustrated in FIG. 4B, an I-beam 76 is provided for mating with and insertion in the I-shaped channel shown in FIG. 4A to lock the stacked frame structures together. A ring 78 or any other well-known device may be attached to one end of the I-shaped bar 76 to allow it to be carried and to be both inserted and removed from the I-shaped slot formed by the abutting frame structure legs 54 and 56 as shown in FIG. 4A. Thus, the units may be quickly attached to each other in a rigid fashion and in a manner which will safely hold the stacked frame structures as shown in FIGS. 2 and 3 such that they can be quickly assembled and disassembled and yet provide a safe structure when assembled.

Figure 1:
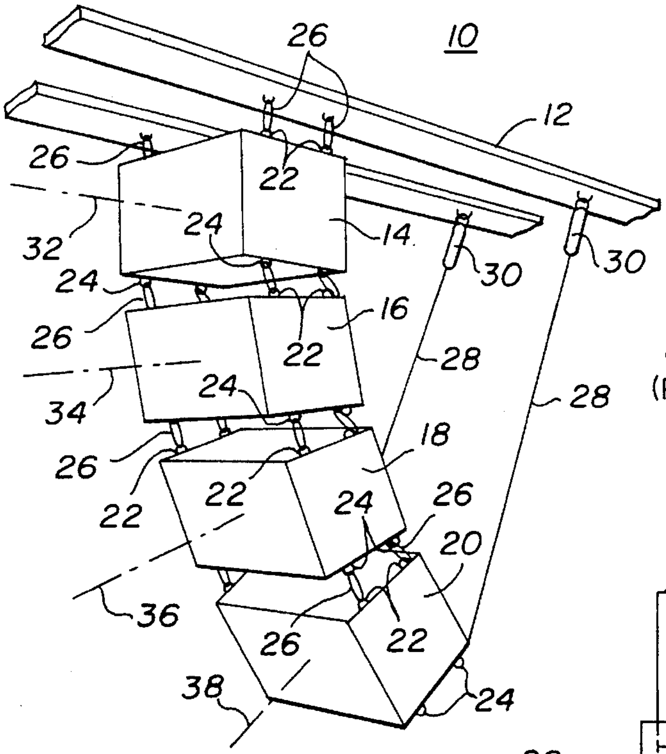
FIG. 1 (PRIOR ART)
FIG. 1 is a schematic representation of the prior art manner of obtaining curved loudspeaker performance.
Figure 5:
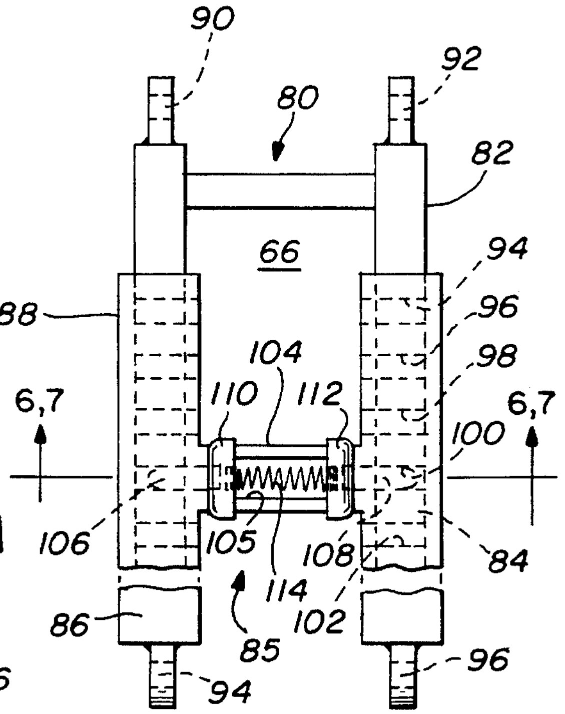
FIG. 5 illustrates the extendable connecting rod that connects each frame to its loudspeaker gray and is adjustable in length to pivotally position the loudspeaker array.
Figure 6:
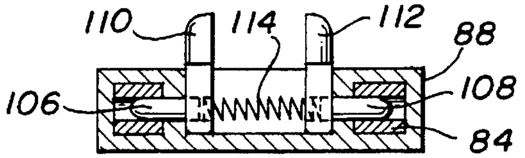
FIG. 6 is a schematic sectional view of the connecting rod in FIG. 5 illustrating the spring-loaded finger clips for engaging and disengaging the telescoping rods with each other to change the length thereof.
Figure 7:
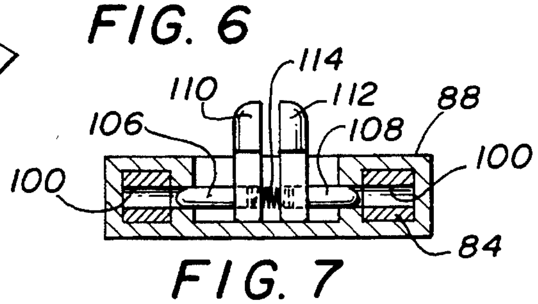
FIG. 7 is an end view illustrating the finger clips moved together to allow telescoping movement of the telescoped rods.

The adjustable length connector 66 for pivotally connecting the loudspeaker array to each frame structure is illustrated in detail in FIG. 5. In the preferred embodiment, a first set of spaced arms 80 having a first end 82 and a second end 84 is slidably inserted in a hollow second set of spaced arms 85 also having a first end 86 and a second end 88. The first end 82 of the first set of parallel spaced arms 80 may be pivotally attached to either the loudspeaker array or the frame structure by means of orifices 90 and 92. The first end 86 of the other set of spaced arms 85 may be pivotally connected to the other one of the loudspeaker array or the frame structure at orifices 94 and 96. Each parallel arm of the first set of arms 80 has a plurality of orifices 94, 96, 98, 100, and 102 therein. A connecting portion 104 that joins the spaced parallel arms of the second set of arms 85 has a slot 105 therein in which opposing spring-loaded pins 106 and 108 are slidably mounted. A spring 114 forces the pins 106 and 108 outwardly through the orifices in both the first and second sets of arms 80 and 85 thereby locking the two sets together. By grasping the finger clips 110 and 112 and forcing them together against spring 114, the pins 106 and 108 are removed from the orifices in the inner parallel arms of the first set of arms 80, as shown in FIG. 7, thereby allowing the first set of arms 80 to be slidably adjusted with respect to the second set of arms 85 thereby changing the length thereof and pivoting the speaker to the desired position. FIG. 6 is a cross-sectional view of FIG. 5 illustrating the pins in their locking position.

Figure 8:
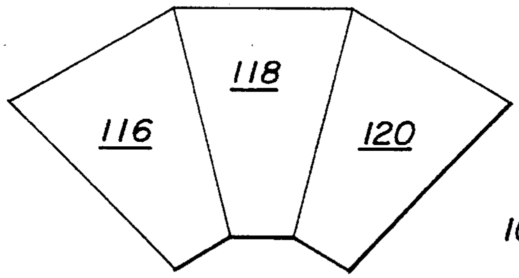
FIG. 8; is a top view of an array of stacked speakers of the type shown in FIGS. 2 and 3.

FIG. 8 is a top view of three stacks of speakers 116, 118, and 120 shown FIG. 2 and FIG. 3 to form a desired array for use at a concert or other public presentation.

Thus there has been disclosed a novel spaceframe with array element positioning that allows curved array performance from an array of loudspeakers suspended within a simple vertical framework. A loudspeaker array is pivotally mounted in a spaceframe with a tilting mechanism. The spaceframe comprises a plurality of stacked frame structures that are attached to each other with a quick-disconnect device for easy and rapid assembly and disassembly. The tilting mechanism coupling the loudspeaker system to each frame structure consists of at least one rod slidably inserted within another with the inserted rod having a plurality of orifices through which a spring-loaded pin through an orifice in the outer rod or tube can be inserted and removed from the orifices quickly and easily thus allowing the speakers to be tilted at predetermined angles in a rapid and easy fashion.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

We claim:

1. A spaceframe with loudspeaker array positioning including:

a frame structure having a top and bottom and a front and back;

at least one loudspeaker array having a sound-emitting axis and being pivotally mounted on said frame structure with the sound-emitting axis pointed toward the front of said frame structure and having pivotal movement in a vertical plane; and an adjustable length tilt mechanism attached between said frame structure and said loudspeaker array for independently tilting said at least one loudspeaker array about said pivotal point so as to tilt and hold said loudspeaker sound-emitting axis in a desired direction in the vertical plane to provide sound to a defined listening area, said adjustable tilt mechanism including:

a first hollow arm having first and second ends with the first end pivotally connected to said frame structure;

a second arm having third and fourth ends with the third end pivotally connected to said loudspeaker array and said second and fourth ends of said first and second arms being slidably coupled to each other; and locking means for fixedly positioning said second arm with respect to said first arm to position said loudspeaker sound-emitting axis within said frame structure in said desired direction.

2. A spaceframe as in claim 1 further including:

a plurality of said frame structures vertically stacked on top of each other; and said loudspeaker array in each frame structure being individually positioned to aim said loudspeaker sound-emitting axis in said desired direction to form a predetermined sound pattern.

3. A spaceframe as in claim 2 further including connection means for detachably attaching each frame to each other to form a unitary structure.

4. A spaceframe as in claim 3 wherein said connecting means includes:

a pair of spaced horizontal leg portions on the top and bottom of each frame structure;

a T-shaped channel extending longitudinally at least partially through each horizontal leg portion on the bottom of each frame structure;

an inverted T-shaped channel extending longitudinally at least partially through each horizontal leg portion on the top of each frame structure such that when one frame structure is stacked on top of the other, an I-shaped channel is formed by the abutting T-shaped channels; and an I-beam for mating with and insertion in said I-shaped channel to lock said stacked frame structures together.

5. Apparatus for providing a predetermined loudspeaker sound pattern including:

a plurality of stacked frame structures rigidly and detachably attached to each other;

a loudspeaker array pivotally mounted in each frame structure for pivotal movement in a vertical plane and having a sound-emitting axis; and an adjustable tilt mechanism pivotally connected between each individual frame structure and each corresponding individual loudspeaker array for separately and independently tilting each said loudspeaker array to point said sound-emitting axis of each loudspeaker array in a desired direction in the vertical plane for creating said predetermined sound pattern.

6. Apparatus as in claim 5 further including:

at least one horizontal leg on each of the stacked frame structures in mating stacked relationship with a corresponding horizontal leg on the adjacent stacked frame structure;

said mating legs having mating T-shaped slots therein forming an I-shaped slot; and an I-beam for removable insertion in said I-shaped slot to form a quick disconnect for easy assembly and disassembly of said stacked adjacent frame structure.

7. Apparatus as in claim 5 wherein said adjustable tilt mechanism includes:

a first set of spaced arms and a second set of spaced arms, each set having first and second ends;

the first ends of said first set of arms being pivotally connected to a corresponding one of said frame structures and the first ends of said second set of spaced arms being pivotally connected to a corresponding one of said loudspeaker arrays;

one set of said spaced arms being hollow;

the second end of the other set of said spaced arms being inserted in the second end of said hollow set of spaced arms to form said tilt mechanism with said adjustable length; and a quick disconnect locking device coupled to said first and second sets of arms to enable adjustment of said tilt mechanism length, thereby aiming said sound-emitting axis of said loud speaker array in a vertical plane.

8. Apparatus as in claim 5 further including a plurality of vertically spaced horizontal bars on each of said frame structures to form a ladder when said frame structures are stacked on top of each other so as to enable assemblers and disassemblers to have ready access to any one of said stacked frame structures.

9. Apparatus for providing a predetermined sound pattern from a plurality of loudspeakers each of which has a sound-emitting axis, said sound pattern approximating the sound pattern of a curved array of loudspeakers, the apparatus including:

a vertical framework formed of a plurality of spaced, vertically arranged loudspeaker arrays, each array being independently and pivotally attached to said framework for pivotal movement in a vertical plane to a desired position; and at least one arm adjustable in length and coupled between each loudspeaker array and said vertical framework for independently holding its respective loudspeaker array in said desired position to point each loudspeaker sound-emitting axis in a desired direction in the vertical plane to provide increased sound coverage in the vertical plane substantially equivalent to the sound pattern performance of a curved array of loudspeakers.

10. A method of providing a predetermined sound pattern in the vertical plane equivalent to a curved loudspeaker array sound pattern performance comprising the steps of:

arranging a plurality of loudspeakers in a vertical frame, each loudspeaker having a sound-emitting axis;

forming said vertical frame with a plurality of stacked individual frames;

pivotally attaching each of said loudspeakers independently to each of said individual frames for aiming each sound-emitting axis in the vertical plane;

independently adjusting each loudspeaker at a predetermined angle in said frame to aim the sound-emitting axes in different directions in the vertical plane to create the predetermined sound pattern; and providing a quick disconnect between adjacent stacked individual frames for ease in assembling and disassembling said stack of individual frames.

11. A method as in claim 10 wherein the step of pivotally attaching a loudspeaker to each of said individual frames further includes the steps of:

inserting a first rod in a second hollow rod in a telescoping manner to form a telescoping rod of variable length;

pivotally attaching one end of one of said telescoping rods to said individual frame and the other end to said loudspeaker such that by varying the length of the telescoping rod the loudspeaker is pivoted in the vertical plane and the sound-emitting axis of said loudspeaker is movable to a selected vertical position; and providing a quick disconnect for said telescoping rod to lock said telescoping rod in a desired fixed length.

12. A method as in claim 11 further including the steps of:

providing a plurality of spaced orifices in the first rod; and attaching a spring-loaded pin to the second rod to removably engage any one of said spaced orifices and lock said first rod to said second rod to form a telescoping rod of fixed length.

* * * * *